(12) United States Patent
Chang et al.

(10) Patent No.: US 6,849,504 B2
(45) Date of Patent: Feb. 1, 2005

(54) METHOD FOR FABRICATING FLASH MEMORY

(75) Inventors: Ping-Yi Chang, Kaohsiung (TW); Pei-Ren Jeng, Hsinchu (TW)

(73) Assignee: MACRONIX International Co., Ltd, Hsinchu (TW)

( * ) Notice: Subject to any disclaimer, the term of this patent is extended or adjusted under 35 U.S.C. 154(b) by 0 days.

(21) Appl. No.: 10/064,266

(22) Filed: Jun. 27, 2002

(65) Prior Publication Data

US 2004/0002190 A1 Jan. 1, 2004

(51) Int. Cl.$^7$ .......................................... H01L 21/8247

(52) U.S. Cl. ..................... 438/261; 438/287; 438/931

(58) Field of Search ................... 438/105, 216, 438/261, 287, 591, 623, 931

(56) References Cited

U.S. PATENT DOCUMENTS

| | | | | |
|---|---|---|---|---|
| 6,492,222 B1 | * | 12/2002 | Xing | 438/240 |
| 6,492,734 B2 | * | 12/2002 | Watanabe | 438/622 |
| 2002/0115310 A1 | * | 8/2002 | Ueda | 438/945 |
| 2002/0155689 A1 | * | 10/2002 | Ahn et al. | 438/592 |
| 2003/0027413 A1 | * | 2/2003 | Tsui | 438/586 |

* cited by examiner

*Primary Examiner*—Chandra Chaudhari
(74) *Attorney, Agent, or Firm*—Jiang Chyun IP Office

(57) ABSTRACT

A method for fabricating a flash memory is described. A stacked gate structure and a source/drain are formed on a substrate. An inter-layer dielectrics and a plurality of inter-metal dielectric layers are then formed over the substrate, wherein at least one layer among the inter-layer dielectrics and the inter-metal dielectric layers has a silicon carbide layer formed thereon. The silicon carbide layer is formed to protect the memory device from an UV irradiation, so as to prevent data errors occurring in the memory device.

17 Claims, 2 Drawing Sheets

METHOD FOR FABRICATING FLASH MEMORY

BACKGROUND OF INVENTION

1. Field of Invention

The present invention relates to a method for fabricating a non-volatile memory (NVM). Particularly, the present invention relates to a method for fabricating a flash memory.

2. Description of Related Art

Flash memory is a type of electrically erasable programmable read-only memory ($E^2$ PROM). A flash memory can be programmed, read, and erased repeatedly and can retain data even if power is switched off, and therefore is widely used in personal computers and in electronic apparatuses.

A conventional flash memory uses a floating gate and a control gate both made from doped polysilicon. When the flash memory is to be programmed, the control gate and the source/drain of a selected memory cell are applied with appropriate biases. An electron flow from the source to the drain is thereby induced in the channel. The electron flow can produce hot electrons that will tunnel through the tunnel oxide layer and into the floating gate and will distribute evenly in the floating gate. A flash memory is usually programmed by the above-mentioned channel hot-electron injection (CHEI) mechanism and is usually erased by the Fowler-Nordheim tunneling mechanism. The disadvantage of the conventional flash memory is that a leakage easily occurs in the memory cell if there are weak points in the tunnel oxide layer, and the reliability of the device is thus lowered.

To solve the leakage problem of a flash memory, a charge-trapping layer is recently developed to replace the polysilicon floating gate in the conventional flash memory. The charge-trapping layer usually comprises a silicon nitride layer that is disposed between two silicon oxide layers to form an oxide/nitride/oxide (ONO) composite layer, while the memory with a nitride charge-trapping layer is known as a "nitride read-only memory (NROM)". In a NROM, the nitride charge-trapping is able to trap electrons so that the injected hot electrons will not distribute evenly in the charge-trapping layer, but will be localized in a region of the charge-trapping layer near the drain with a Gaussian spatial distribution. Because the injected electrons are localized, the charge-trapping region is small and is less likely to locate on the weak points of the tunnel oxide layer. A leakage therefore does not easily occur in the device.

Besides, since the electrons are localized in a region of the charge-trapping layer near the drain, the NROM is capable of storing two bits in one memory-cell. This is achieved by changing the direction of the current in the channel and thus varying the generating site and the injecting region of the hot electrons. Particularly, if a higher bias is applied to the first source/drain doped region of the memory cell, hot electrons will be generated and be injected into the charge-trapping layer near the second source/drain doped region. Similarly, if a higher bias is the applied to the second source/drain doped region, hot electrons will be generated and be injected into the charge-trapping layer near the first source/drain doped region. Thus, a memory cell can be configured into one of the four states, in which each of the two ends of the charge-trapping layer may have one group of electrons with a Gaussian spatial distribution or have zero electron trapped in it.

Currently, a NROM such formed is easily affected by the process conditions. For example, when a NROM is exposed to an UV irradiation, electron-hole pairs will be created in the substrate and some of the electrons generated will diffuse into the charge-trapping layer. Since the electrons stored in the charge-trapping layer are difficult to eliminate, data errors are encountered in the NROM device.

SUMMARY OF INVENTION

To solve the above-mentioned problems of the prior art, this invention provides a method for fabricating a flash memory, which can protect the memory device from an UV irradiation to prevent data errors.

A method for fabricating a flash memory of this invention is described below. A stacked gate structure and a source/drain are formed on a substrate. An inter-layer dielectrics (ILD) and a plurality of inter-metal dielectric (IMD) layers are then formed on the substrate, wherein at least one layer among the inter-layer dielectrics and the inter-metal dielectric layers has a silicon carbide layer formed thereon. The silicon carbide layer is formed to protect the device from an UV irradiation.

Since the silicon carbide layer formed on the inter-layer dielectrics or on the inter-metal dielectrics is capable of absorbing an UV irradiation, the underlying memory cells can be protected. The silicon carbide layer also lowers the intensity of the reflective light in a subsequent lithography process, and thus serves as a dielectric anti-reflection coating (DARC) at the same time. In addition, the silicon carbide layer is capable of blocking the mobile ions during the subsequent processes and has the effect of filling the scratches on the underlying dielectric layer caused by a chemical mechanical polishing (CMP) process.

Besides, the silicon carbide layer is not only limited to form on one inter-layer dielectrics or on one inter-metal dielectrics. The silicon carbide layer can also be formed on both an inter-layer dielectrics and an inter-metal dielectrics, or even on more than two inter-metal dielectric layers.

Since the silicon carbide layer having a large absorption for the UV light is formed on the inter-layer dielectrics or on the inter-metal dielectrics, the device can be protected from an UV irradiation. Therefore, few electrons are generated and injected into the charge-trapping layer of the flash memory, and thus data errors are substantially decreased and the process yield is increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Referring now to FIGS. 1A–1F, the process flow of fabricating a flash memory according to a preferred embodiment of this invention will be described hereafter.

Figure 1A:
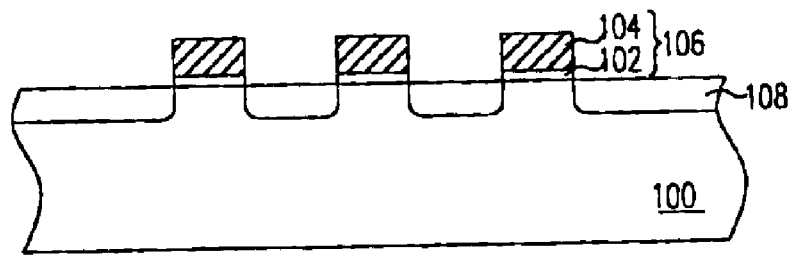
FIGS. 1A–1F illustrate a process flow of fabricating a flash memory device according to a preferred embodiment of this invention in a cross-sectional view.

Refer to FIG. 1A, a substrate 100, such as a silicon substrate, is provided and then a composite dielectric layer 102 and a gate conductive layer 104 are sequentially formed on the substrate 100. The composite dielectric layer 102 may have a silicon oxide/silicon nitride/silicon oxide (ONO) structure comprising a tunnel oxide layer, a nitride charge-trapping layer, and a silicon oxide layer. The gate conductive layer 104 is, for example, a polycide layer comprising a doped polysilicon layer and a metal silicide layer such as a tungsten silicide layer. The doped polysilicon layer is formed by, for example, chemical vapor deposition (CVD) with in-situ doping. The tungsten silicide is formed by, for example, low pressure chemical vapor deposition (LPCVD) with $WF_6$ and $SiH_4$ as reaction gases.

The gate conductive layer 104 and the composite dielectric layer 102 are then patterned into a plurality of stacked gate structures 106 with lithographic and etching techniques. A source/drain region 108 is then formed in the substrate 100 beside the stacked gate structures 106 by conducting an ion implantation on the substrate 100, for example.

Figure 1B:
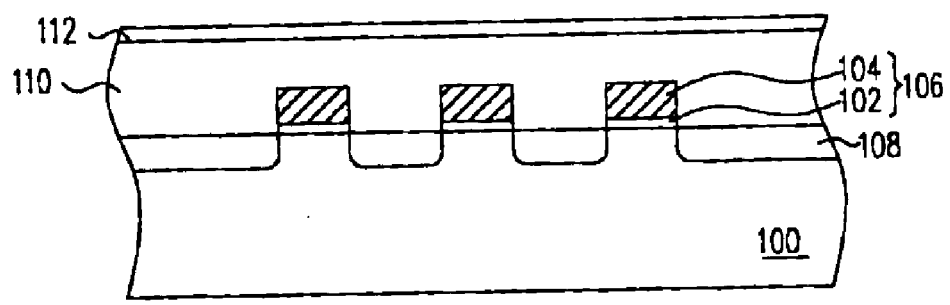

Refer to FIG. 1B, an inter-layer dielectrics 110 is formed on the substrate 100. The inter-layer dielectrics 110 comprises silicon oxide, phosphorous silicate glass (PSG), or boron-phosphorous silicate glass (BPSG), and is formed by chemical vapor deposition (CVD). A planarization process, such as a chemical mechanical polishing (CMP) process or an etching-back process, is then performed to planarize the surface of the inter-layer dielectrics 110.

A protective layer 112 is then formed on the inter-layer dielectrics 110. The protective layer 112 comprises, for example, silicon carbide and is formed by chemical vapor deposition, and has a thickness of about 100 Å to about 1000 Å, preferably from about 300 Å to about 500 Å. Since the silicon carbide material of the protective layer 112 has an absorption peak at 248 nm on the spectrum, an UV irradiation will not penetrate into the substrate 100 to affect the memory cell, while the intensity of the reflective light in the subsequent lithography process can be lowered simultaneously. That is, the SiC protective layer 112 can also serve as a dielectric anti-reflective coating (DARC). Besides, since the silicon carbide material has a high density, the SiC protective layer 112 is capable of preventing the mobile ions, such as $H^+$, produced in the subsequent process from entering the underlying device. Meanwhile, the SiC protective layer 112 can fill the scratches on the underlying dielectric layer that are caused by the chemical mechanical polishing (CMP) process.

Figure 1C:
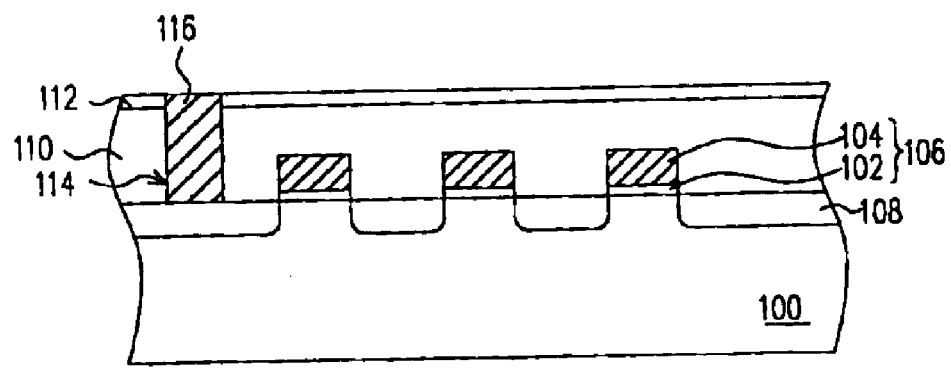

Refer to FIG. 1C, a lithography process and an etching process are then conducted to form a contact hole 114 in the inter-layer dielectrics 110 exposing a portion of the source/drain region 108, A contact 116 is then formed in the contact hole 114, which is accomplished by forming a conductive layer (not shown) over the substrate 100 and then removing the conductive layer outside the contact hole 114. The conductive layer comprises, for example, aluminum (Al), titanium (Ti), chromium (Cr), tungsten (W), cobalt (Co), nickel (Ni), or copper (Cu), and is formed by a method including physical vapor deposition (PVD), such as sputtering. Moreover, the method for removing the conductive layer outside the contact hole 114 is, for example, dry etching or chemical mechanical polishing (CMP).

Figure 1D:
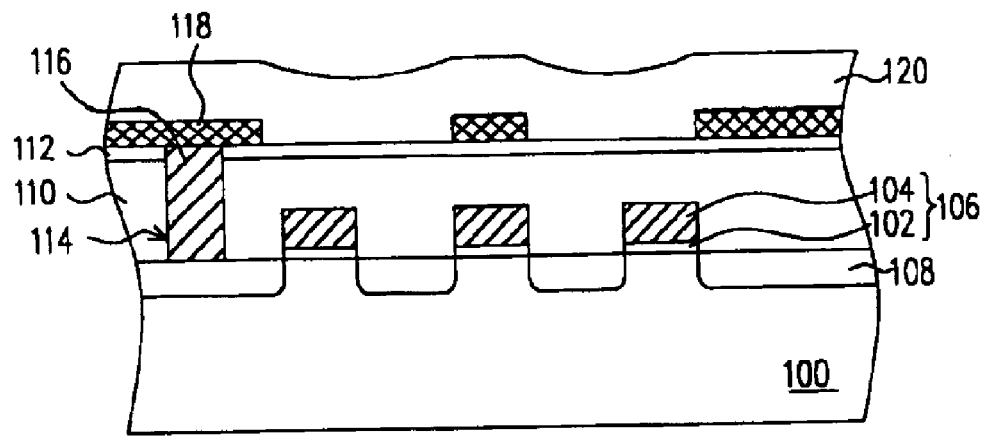

Refer to FIG. 1D, a metal interconnection 118, which comprises a material such as Al, Ti, Cr, W, Co, Ni, Cu, is then formed on the protective layer 112. The metal interconnection 118 is formed by patterning a conductive layer (not shown) formed on the protective layer 112, while the conductive layer is fabricated by a method including physical vapor deposition (PVD), such as sputtering.

Refer to FIG. 1D again, an inter-metal dielectrics 120 is then formed over the substrate 100. The inter-metal dielectrics 120 comprises, for example, silicon oxide formed by high density plasma enhanced chemical vapor deposition (HDPECVD).

Figure 1E:
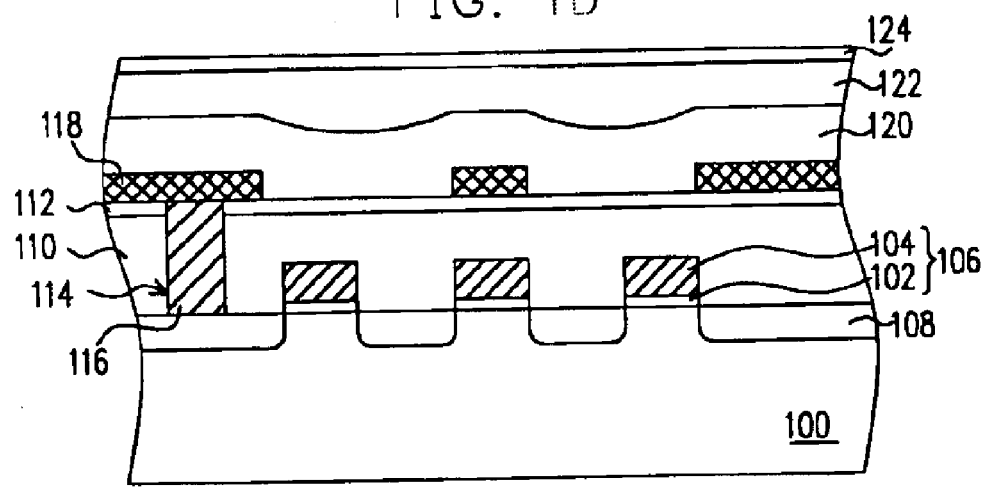

Refer to FIG. 1E, another inter-metal dielectrics 122 is then formed on the inter-metal dielectrics 120, the inter-metal dielectrics 122 comprising, for example, silicon oxide formed by plasma enhanced chemical vapor deposition (PECVD) with tetraethyl-ortho-silicate (TEOS) and $O_3$ as a reaction gas. A planarization process, such as a chemical mechanical polishing (CMP) process or an etching-back process, is then performed to planarize the surface of the inter-metal dielectrics 122. A protective layer 124 is then formed on the inter-metal dielectrics 122. The protective layer 124 comprises, for example, silicon carbide and is formed by chemical vapor deposition, and has a thickness of about 100 Å to about 1000 Å, preferably from about 300 Å to about 500 Å. Since the silicon carbide material of the protective layer 124 has an absorption peak at 248 nm on the spectrum, an UV irradiation will not penetrate into the substrate 100 to affect the memory cell, while the intensity of the reflective light in a subsequent lithography process can be lowered simultaneously. In other words, the SiC protective layer 124 can also serve as a dielectric anti-reflective coating (DARC). Besides, since the silicon carbide material has a high density, the SiC protective layer 124 is capable of preventing the mobile ions, such as $H^+$, produced in the subsequent processes from entering the underlying device. Meanwhile, the SiC protective layer 124 can fill the scratches on the underlying dielectric layer caused by the chemical mechanical polishing (CMP) process.

Figure 1F:
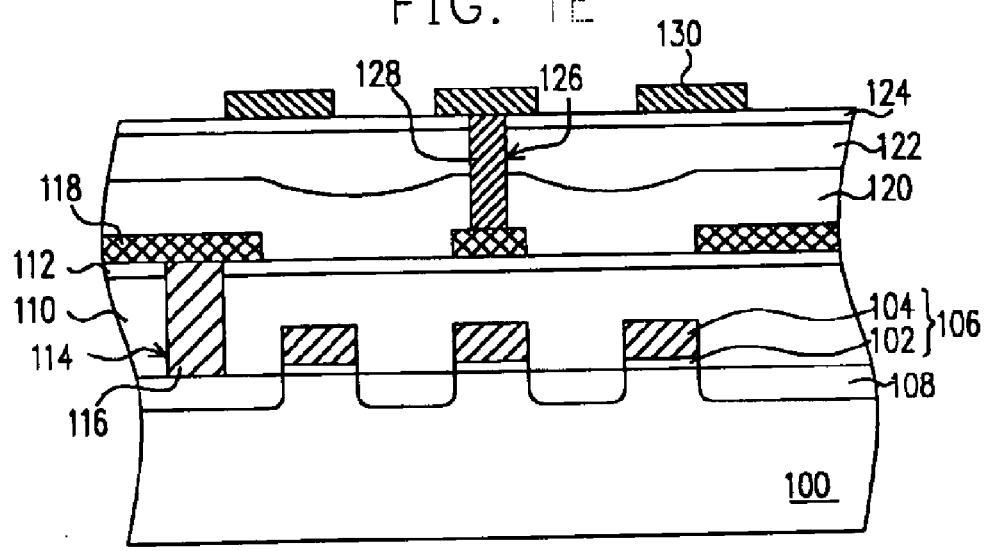

Refer to FIG. 1F, the protective layer 124 and the inter-metal dielectrics 122 are then patterned with lithographic and etching techniques to form a via hole 126 that exposes a portion of the metal interconnection 118. The via hole 126 is then filled with a via plug 128, which is formed by depositing a conductive layer (not shown) over the substrate 100 and then removing the conductive layer outside the via hole 126. The conductive layer comprises a material such as Al, Ti, Cr, W, Co, Ni, Cu and is formed by a method including physical vapor deposition, such as sputtering, while the conductive layer outside the via hole 126 is removed by, for example, dry etching or chemical mechanical polishing (PVD). Metal interconnection 130, which comprises a material such as Al, Ti, Cr, W, Co, Ni, Cu, is then formed on the protective layer 124. The metal interconnection 130 is formed by patterning a conductive layer (not shown) formed on the protective layer 124, wherein the conductive layer is fabricated by a method including physical vapor deposition, such as sputtering.

According to the above-mentioned preferred embodiment of this invention, a silicon carbide layer is formed on the inter-layer dielectrics or on the inter-metal dielectrics to protect the device from the UV irradiation, and therefore the underlying memory cells will not be affected. Besides, the silicon carbide layer can lower the intensity of the reflective light in a subsequent lithography process, and thus can serve as a dielectric anti-reflection coating (DARC). In addition, the silicon carbide layer is capable of blocking the mobile ions during the subsequent processes and has an effect of filling the scratches on the underlying dielectric layer caused by the chemical mechanical polishing (CMP) process.

Since the silicon carbide layer having an effective absorption for the UV light is formed on the inter-layer dielectrics or on the inter-metal dielectrics, the device can be protected from the UV irradiation. Therefore, data errors of the memory device are decreased substantially.

Besides, the silicon carbide layer is not only limited to form on one inter-layer dielectrics or on one of the of inter-metal dielectrics. The silicon carbide layer can also be formed on both the inter-layer dielectrics and the inter-metal dielectrics, or even on more than two inter-metal dielectric layers.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a flash memory, comprising the steps of:

forming a stacked gate structure and a source/drain on a substrate;

forming an inter-layer dielectrics on the substrate; and forming a plurality of inter-metal dielectric layers on the substrate, wherein at least one layer among the inter-layer dielectrics and the inter-metal dielectric layers has a silicon carbide layer of about 100 Å to about 1000 Å thick formed thereon to absorb UV irradiation.

2. The method of claim 1, wherein a thickness of the silicon carbide layer ranges from about 300 Å to about 500 Å.

3. The method of claim 1, wherein forming the stacked gate structure comprises:

forming a composite dielectric layer on the substrate;

forming a gate conductive layer on the composite dielectric layer; and patterning the gate conductive layer and the composite dielectric layer.

4. The method of claim 3, wherein the composite dielectric layer comprises a tunnel oxide layer, a silicon nitride layer, and a silicon oxide layer.

5. The method of claim 3, wherein the gate conductive layer comprises a doped polysilicon layer and a metal silicide layer.

6. The method of claim 3, wherein the method for forming the gate conductive layer comprises chemical vapor deposition (CVD).

7. A method for fabricating a flash memory, comprising the steps of:

forming a stacked gate structure and a source/drain on a substrate;

forming an inter-layer dielectrics on the substrate; and forming a silicon carbide layer of about 100 Å to about 1000 Å thick on the inter-layer dielectrics for absorbing UV irradiation.

8. The method of claim 7, wherein a thickness of the silicon carbide layer ranges from about 300 Å to about 500 Å.

9. The method of claim 7, wherein forming the stacked gate structure comprises:

forming a silicon oxide/silicon nitride/silicon oxide (ONO) composite layer on the substrate;

forming a gate conductive layer on the ONO composite layer; and patterning the gate conductive layer and the ONO composite layer.

10. The method of claim 9, wherein the gate conductive layer comprises a doped polysilicon layer and a metal silicide layer.

11. A method for fabricating a flash memory, comprising the steps of:

forming a stacked gate structure and a source/drain on a substrate;

forming an inter-layer dielectrics on the substrate;

forming a contact in the inter-layer dielectrics;

forming a metal interconnection on the inter-layer dielectrics;

forming an inter-metal dielectrics on the substrate; and forming a first silicon carbide layer of about 100 Å to about 1000 Å thick on the inter-metal dielectrics for absorbing UV irradiation.

12. The method of claim 11, wherein forming the stacked gate structure comprises:

forming a silicon oxide/silicon nitride/silicon oxide (ONO) composite layer on the substrate;

forming a gate conductive layer on the ONO composite layer; and patterning the gate conductive layer and the ONO composite layer.

13. The method of claim 12, wherein the gate conductive layer comprises a doped polysilicon layer and a metal silicide layer.

14. The method of claim 13, wherein the metal silicide layer comprises a tungsten silicide layer.

15. The method of claim 12, wherein the method for forming the gate conductive layer comprises chemical vapor deposition (CVD).

16. The method of claim 11, further comprising forming a second silicon carbide layer on the inter-layer dielectrics before the contact is formed in the inter-layer dielectrics.

17. The method of claim 16, wherein a thickness of the second silicon carbide layer ranges from about 300 Å to about 500 Å.

* * * * *